United States Patent
Liang et al.

(10) Patent No.: US 7,940,847 B2
(45) Date of Patent: May 10, 2011

(54) FREQUENCY SYNTHESIZER AND FREQUENCY SYNTHESIZING METHOD

(75) Inventors: Che-Fu Liang, Taipei County (TW); Shen-Iuan Liu, Taipei (TW); Gin-Kou Ma, Hsinchu County (TW); Tzu-Yi Yang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 1138 days.

(21) Appl. No.: 11/645,724

(22) Filed: Dec. 27, 2006

(65) Prior Publication Data

US 2008/0031371 A1    Feb. 7, 2008

(30) Foreign Application Priority Data

Aug. 3, 2006    (TW) ............................ 95128474 A

(51) Int. Cl.
*H04K 1/10*    (2006.01)
*H04L 27/28*   (2006.01)

(52) U.S. Cl. ........ 375/260; 370/203; 370/204; 370/208; 375/373; 375/376; 455/260

(58) Field of Classification Search .......... 375/130–132, 375/260, 371–376; 455/260; 370/203–211
See application file for complete search history.

(56) References Cited

U.S. PATENT DOCUMENTS

| | | | |
|---|---|---|---|
| 5,408,201 A | 4/1995 | Uriya | |
| 2004/0131130 A1 | 7/2004 | Shor et al. | |
| 2007/0066262 A1* | 3/2007 | Mishra | 455/260 |
| 2007/0178869 A1* | 8/2007 | Park et al. | 455/260 |

OTHER PUBLICATIONS

Liang et al., Feb. 6, 2006, IEEE International Solid-State Circuits Conference, Digest of Technical Papers. vol. 49, pp. 126-127.*
A 7-Band 3-8GHz Frequency Synthesizer with 1ns Band-Switching Time in 0.18μm CMOS Technology.
Liang et al., Feb. 6, 2006, IEEE International Solid-State Circuits Conference, Digest of Technical Papers, vol. 49.

* cited by examiner

*Primary Examiner* — Curtis B Odom
(74) *Attorney, Agent, or Firm* — Birch, Stewart, Kolasch & Birch, LLP

(57) ABSTRACT

A frequency synthesizer for generating a plurality of frequencies of a MB-OFDM UWB system is disclosed, wherein the frequencies include first to fourteenth frequencies from low to high and any of the adjacent two frequencies differs by a basic intervallic frequency. The frequency synthesizer includes a phase locked loop generating an initial signal with a frequency equal to the second frequency, an intervallic frequency generator generating first to third intervallic frequencies from low to high and all being integers times the basic intervallic frequency and generating a forth intervallic frequency equal to the basic intervallic frequency, and first to third mixers connected in series, respectively receiving the fourth intervallic frequency, one of the first to third intervallic, and the first intervallic frequency, to respectively generate the first to third frequencies, the fourth to ninth and the thirteenth to fourteenth frequencies, and the tenth to twelfth frequencies.

34 Claims, 15 Drawing Sheets

FREQUENCY SYNTHESIZER AND FREQUENCY SYNTHESIZING METHOD

BACKGROUND OF THE INVENTION

1. Field of the Invention

The invention relates to a frequency synthesizer and more particularly to a frequency synthesizer in a multi-band orthogonal frequency division multiplexing (MB-OFDM) ultra wideband (UWB) system.

2. Description of the Related Art

The frequency band of a multi-band orthogonal frequency division multiplexing (MB-OFDM) ultra wideband (UWB) system, from about 3.1 to 10.6 GHz, is divided into 14 bands, each having a bandwidth of 528 MHz. FIG. 1 is a band diagram for a MB-OFDM UWB system. As shown, central frequencies of the 14 bands, referred to as first to fourteenth frequencies f1 to f14 from left to right, are respectively 3432 MHz, 3960 MHz, 4488 MHz, 5016 MHz, 5544 MHz, 6072 MHz, 6600 MHz, 7128 MHz, 7656 MHz, 8184 MHz, 8712 MHz, 9240 MHz, 9768 MHz, 10296 MHz, with any adjacent two frequencies separated by a base frequency fdm (528 MHz).

MB-OFDM UWB systems require that the frequency synthesizer generating the 14 frequencies has high band switching speed. Typically the switching time must be less than 9.5 ns. Several UWB frequency synthesizers have been proposed to generate a band within 3~8 G. The following are representatives among them: [1] J. Lee, and D. W. Chiu, "A 7-Band 3-8 GHz frequency synthesizer with 1 ns band-switching time in 0.18 um CMOS technology," ISSCC Dig of Tech. Papers, pp. 204-205, February 2005, [2]: C. C. Lin, and C. K Wang, "A regenerative semi-dynamic frequency divider for mode-1 MB-OFDM UWB hopping carrier generation," ISSCC Dig of Tech. Papers, pp. 206-207, February 2005, [3]: A. Ismail, and A. Abidi, "A 3.1 to 8.2 GHz direct conversion receiver for MB-OFDM UWB communications," ISSCC Dig of Tech. Papers, pp. 206-207, February 2005, and [4]: D. Leenaerts et al., "A SiGe BiCMOS 1ns frequency hopping frequency synthesizer for UWB radio," ISSCC Dig of Tech. Papers, pp. 202-203, February 2005.

None of the UWB frequency synthesizers is capable of generating all 14 frequencies. The reason is that many phase locked loops and mixers are required to cover such a wide band, requiring larger chip area, high power consumption, and excessive spur energy. Additionally, it is difficult to reduce the switching time to less than 9.5 ns.

High-speed wireless transmission is an unavoidable trend in communication development. UWB apparatuses comprise functions in addition to communication. Accordingly, a MB-OFDM UWB system covering the first to fourteenth frequencies, having high switching speed and moderate or low spur energy is desirable.

BRIEF SUMMARY OF THE INVENTION

The invention provides a frequency synthesizing method for generating a plurality of frequencies in a multi-band orthogonal frequency division multiplexing (MB-OFDM) ultra wideband (UWB) system. The invention further provides a frequency synthesizer employing the method. The frequency synthesizer comprises only two phase locked loops and three mixers and has the advantages of low spur energy, lower power consumption and fast switching time.

The invention provides a frequency synthesizing method for generating a plurality frequencies in a MB-OFDM UWB system, the frequencies comprising first to fourteenth frequencies from low to high, any two neighboring thereof separated by a basic intervallic frequency. The method comprises classifying the frequencies into first to fifth frequency groups respectively comprising the first to third frequencies, the fourth to sixth frequencies, the seventh to ninth frequencies, tenth to twelfth frequencies, and the thirteenth to fourteenth frequencies, generating the first frequency group, performing a first frequency mixing procedure on the first frequency group to generate the second, third and fifth frequency groups, and performing a second frequency mixing procedure on the fifth frequency group to generate the fourth frequency group.

An embodiment of the frequency synthesizing method comprises generating first to third intervallic frequencies with magnitudes in ascending order and all integer times are the basic intervallic frequency and selecting one as an intervallic output frequency, generating one of the first to third frequencies as a first output frequency, mixing the first output frequency and the intervallic output frequency to generate a second output frequency, the second output frequency being one of the fourth to ninth frequencies, thirteenth to fourteenth frequencies, and fifteenth frequency, and mixing the second output frequency with the first intervallic frequency to generate the third frequency being one of the tenth to twelfth frequencies.

The invention also provides a frequency synthesizer for generating a plurality frequencies in an MB-OFDM UWB system, the frequencies comprising first to fourteenth frequencies from low to high, any two neighboring frequencies separated by a basic intervallic frequency, the frequency synthesizer comprising a first phase locked loop generating an initial signal having a frequency equal to the second frequency, an intervallic frequency generator generating first to third interval signals having frequencies with magnitudes in ascending order and all integer times the basic intervallic frequency, selecting one thereof as an intervallic output signal, and generating a fourth interval signal having a frequency equal to the basic intervallic frequency, a first mixer performing a frequency mixing procedure on the initial signal and the fourth interval signal to generate a first output signal having a frequency equal to one of the first to third frequencies, a second mixer performing a frequency mixing procedure on the first output signal and the intervallic output signal to generate a second output signal having a frequency equal to one of the fourth to ninth frequencies, thirteenth to fourteenth frequencies, and fifteenth frequency, and a third mixer performing a frequency mixing procedure on the second output signal and the first intervallic signal to generate a third output signal having a frequency equal to one of the tenth to twelfth frequencies.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
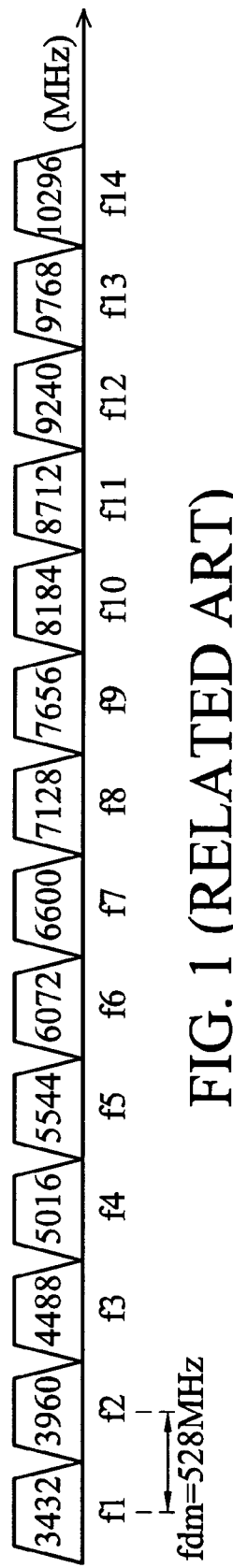
FIG. 1 is a band diagram for an MB-OFDM UWB system.
Figure 2A:
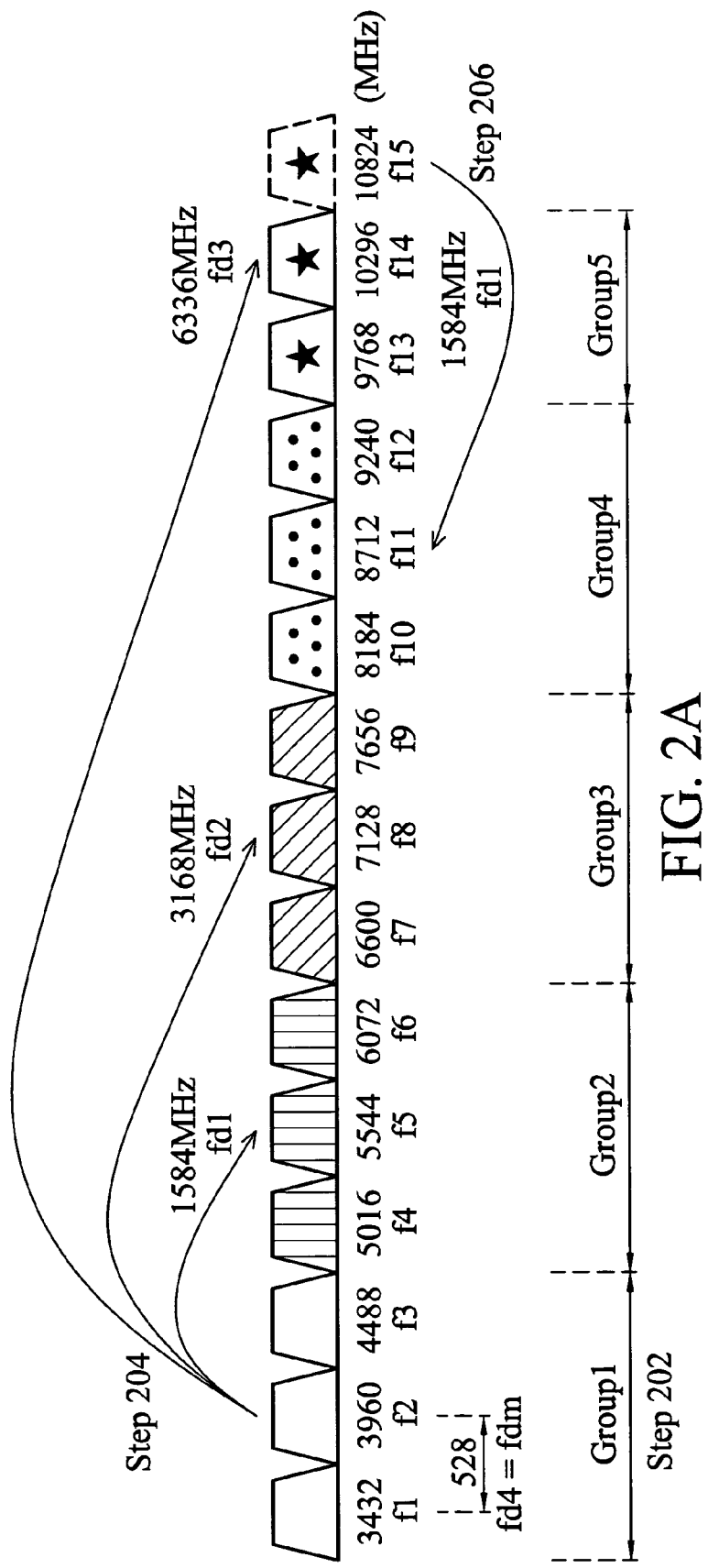
FIG. 2A is a diagram illustrating a frequency generation scheme of the invention.
Figure 2B:
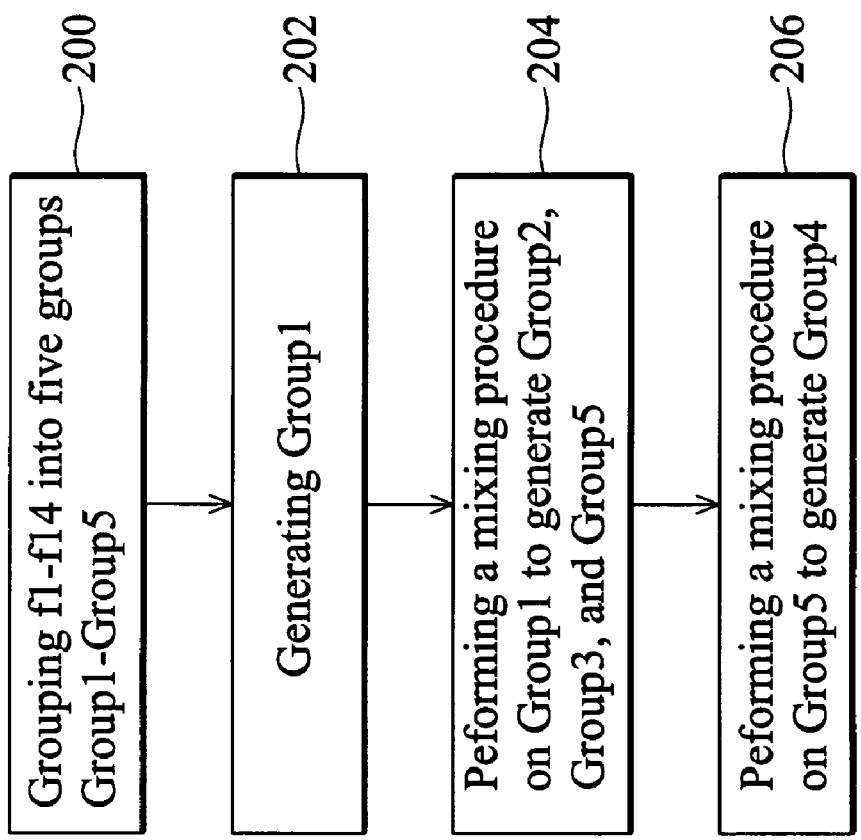
FIG. 2B is a flowchart of a frequency synthesizing method for generating fourteen frequencies of a MB-OFDM UWB system.

FIG. 2A is a diagram illustrating a frequency generation scheme of the invention, and FIG. 2B is a flowchart of a frequency synthesizing method for generating fourteen frequencies in a MB-OFDM UWB system. Referring to FIG. 2A, first to fourteenth frequencies f1 to f14 are illustrated from left to right, respectively representing 3432 MHz, 3960 MHz, . . . , and 10296 MHz in the MB-OFDM UWB system. Any adjacent two of the fourteen frequencies are separated by a basic intervallic frequency fdm (528 MHz). Additionally, a fifteenth frequency f15 is introduced, also separated from the fourteenth frequency f14 by the basis frequency fdm.

Now referring to FIG. 2B, while continuing to refer to FIG. 2A for better comprehension. In step 200, every three frequencies from low to high of the first to fourteenth frequencies f1-f14 are grouped into one of the frequency groups Group1-Group5.

Next, step 202 is performed. In the step, the first frequency group Group1 is generated. Preferably, the second frequency f2 (3960 MHz) and a fourth intervallic frequency fd4 (528 MHz), such as shown in FIG. 2A are first generated and then mixed to generate the first group.

Next, in step 204, a mixing procedure is performed on the first frequency group Group1 to generate the second, third and fifth groups Group2, Goup3 and Group5. In one embodiment, a first, second and third intervallic frequency fd1, fd2, and fd3 from low to high and all being integer times the basic intervallic frequency fdm, such as shown in FIG. 2A, are first generated and then respectively mixed with the first Group1 to generate the second, third and fifth frequency groups Group2, Group3 and Group5.

Step 206 is sequentially performed. In step 206, a mixing procedure is performed to generate the fourth frequency group Group4. In some embodiments, the first intervallic frequency fd1 is first generated and then mixed with the fifth frequency group Group5 to generate the fourth frequency group Group4.

Figure 2C:
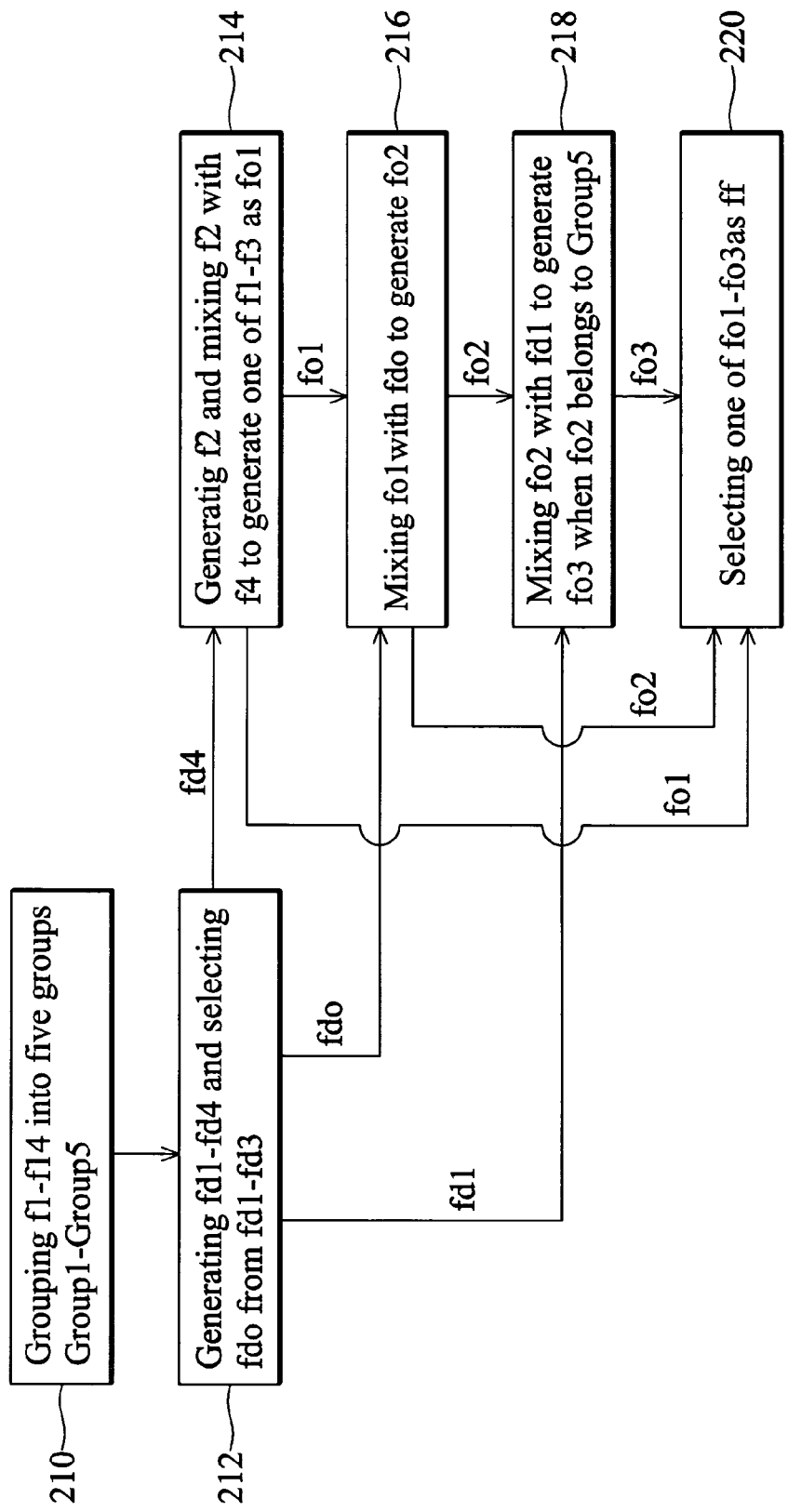
FIG. 2C is a preferable embodiment of the flowchart of FIG. 2B.

FIG. 2C is an embodiment of the flowchart of FIG. 2B. Refer to FIG. 2C, FIGS. 2A, and 2B for better comprehension. Step 210 is the same as step 200. In step 212, first to third intervallic frequencies fd1-fd3, from low to high and being integer times the basis frequency fdm, are first generated, and one thereof is selected as an intervallic output frequency fdo. Also, a fourth frequency fd4, equal to the basic intervallic frequency fdm (528 MHz) is generated in the step. In one embodiment, the first to third intervallic frequencies fd1-fd3 are 3, 6 and 12 times the basic intervallic frequency fdm, respectively, or 1584 MHz, 3168 MHz and 6336 MHz.

In an embodiment of step 212, the second and third frequencies fd2 (3168 MHz) and fd3 (6336 MHz) are first generated, for example, by a phase locked loop (PLL). The PLL comprises a phase frequency detector (PFD), a 8-phase voltage controlled oscillator (VCO) and first to third dividers. The PFD receives a reference frequency fr (e.g. 66 MHz) and an input frequency fp. The 8-phase VCO then generates the second and third intervallic frequencies fd2 and fd3, both with four phases. Next, the second intervallic frequency fd2 is divided by a first integer (e.g. 2) to generate the first intervallic frequency fd1. The first intervallic frequency fd1 is further divided by a second integer (e.g. 3) to generate the fourth frequency fd4. The fourth intervallic frequency fd4 is further divided by a third integer (e.g. 8) to generate the input frequency fp.

Next, step 214 corresponding to step 202 of FIG. 2B is performed to generate one frequency of the first frequency group Group1 (consisting first to third frequencies f1-f3) as a first output frequency fo1. For example, the second frequency fd2 (3960 MHz) is first generated and then mixed with the fourth intervallic frequency fd3 generated in step 212 to generate a first output frequency fo1 optionally as the first frequency f1 (3432 MHz) equal to the second frequency f2 subtracted by the fourth intervallic frequency fd4, the third frequency (4488 MHz) equal to the second frequency f2 added by the fourth intervallic frequency fd4, or the second frequency f2 itself. The optional mixing procedure can be realized by a mixer such as a single side band (SSB) mixer.

Next, in step 216, the first output frequency fo1 generated in step 214 and the intervallic output frequency fdo generated in step 212 receives a selective frequency mixing procedure to generate a second output frequency fo2=fo1+fdo. The mixing procedure can also be realized by a mixer such as a single side band (SSB) mixer. When (fo1,fdo) is selected as (f1,fd1), (f2,fd1), (f3,fd1), (f1,fd2), (f2,fd2), (f3,fd2), (f1,fd3), (f2,fd3), and (f3,fd3), the second output frequency fo2 is f4, f5, f6, f7, f8, f9, f13, f14 and f15 of FIG. 2A, respectively. In summary, when the output intervallic frequency fdo is equal to the first intervallic frequency fd1 (1584 MHz), the second output frequency fo2 belongs to the second frequency group Group2, that is, one of f4, f5, and f6; when the output intervallic frequency fdo is equal to the second intervallic frequency fd2 (3168 MHz), the second output frequency fo2 belongs to the third frequency group Group3, that is, f7, f8, or f9; when the output intervallic frequency fdo is equal to the third intervallic frequency fd3 (6336 MHz), the second output frequency fo2 belongs to the fifth frequency group Group5, that is, f13, f14, or f15. Step 216 corresponds to step 204 of FIG. 2B to generate the second, third and fifth frequency groups Group2, Group3 and Group5 of FIG. 2A.

In step 218, the second output frequency fo2 generated by step 216 and the first intervallic frequency fd1 (1584 MHz) are mixed when the second output frequency fo2 belongs to the fifth Group5 to generate a third output frequency fo3 equal to fo2-fd1. The mixing procedure can be realized with a mixer, such as an SSB mixer. When the second output frequency fo2 is f13, f14 and f15 shown in FIG. 2A, the third output frequency fo3 is equal to f10, f11 and f12, respectively. In other words, step 218 corresponds to step 206 of FIG. 2B to generate the fourth frequency group Group4.

Finally, step 220 is performed to select one of the first to third frequencies fo1-fo3 as a final output frequency ff. Accordingly, the final output frequency ff is selected as one of the first to fourteen frequencies f1-f14. Note that because the fifteenth frequency f15 falls outside the MB-OFDM UWB band, even when the second output frequency fo2 is selected to be the fifth frequency f15, the second output frequency fo2 is not selected as the final output frequency ff in this step.

Figure 3:
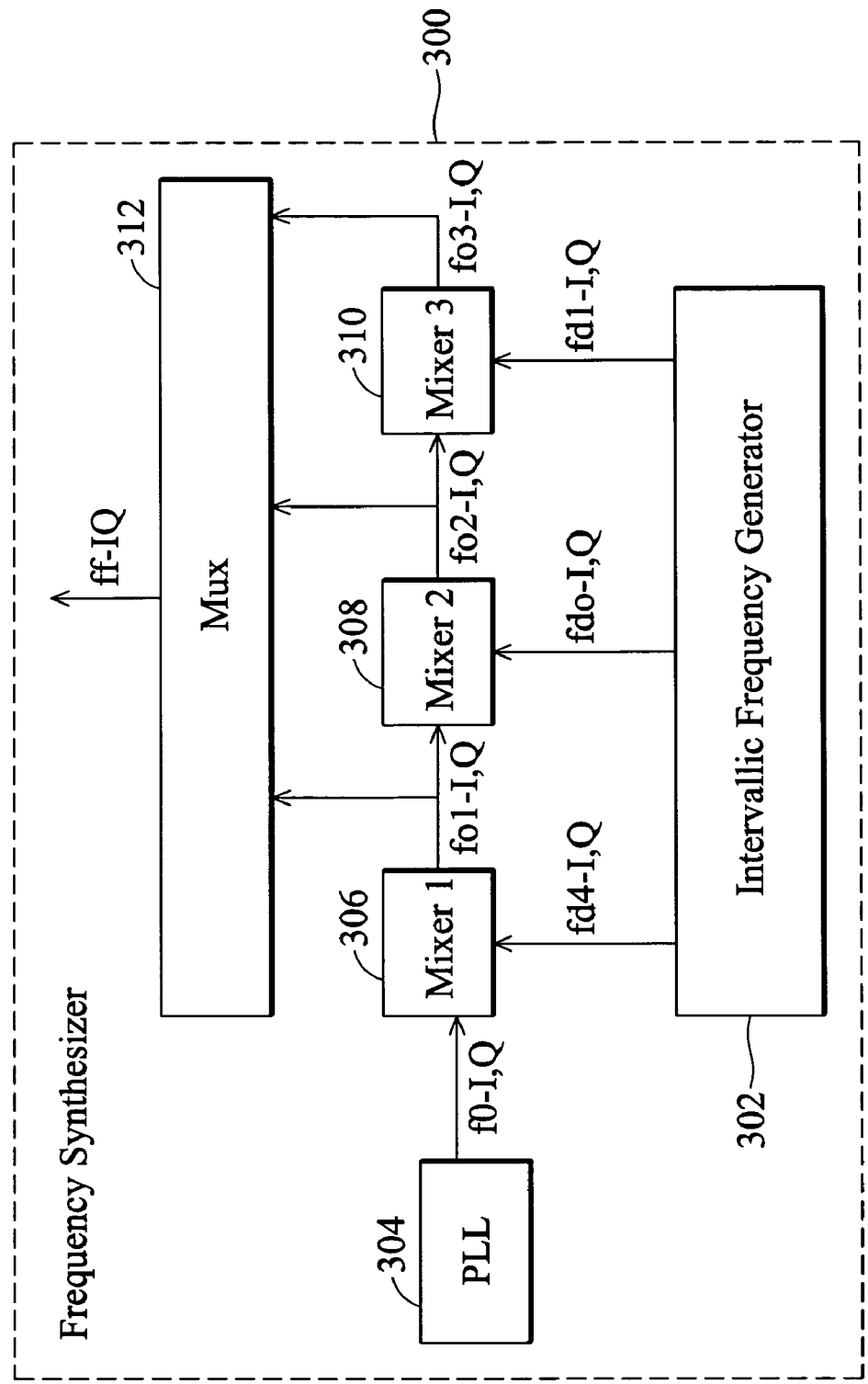
FIG. 3 is a block diagram of a frequency synthesizer applying the methods of FIGS. 2B and 2C.

FIG. 3 is a block diagram of a frequency synthesizer 300 employing the methods of FIGS. 2B and 2C. As shown, the frequency synthesizer 300 comprises an intervallic frequency generator 302, a phase locked loop (PLL) 304, a first mixer 306, a second mixer 308, a third mixer 310, and a multiplexer 312.

The intervallic frequency generator 302 generates first to fourth in-phase interval signals fd1-I to fd4-I and first to fourth quadrature interval signals fd1-Q to fd4-Q with frequency equal to the former but differing in phase by 90°, referred to collectively hereafter as first to fourth interval signals fd1-I,Q to fd4-I,Q. The intervallic frequency generator 302 also generates one of the first to third interval signals fd1-I,Q to fd3-I,Q as an intervallic output signal fdo-I,Q with a frequency referred to hereafter as intervallic output frequency fdo, and then provides the intervallic output signal fdo-I,Q to the second mixer 308. The frequencies of the first to third interval signals fd1-I,Q to fd3-I,Q, with magnitudes in ascending order, are all integer times of the basic intervallic frequency fdm. The frequency of the fourth interval signal fd4-I,Q is equal to the basic intervallic frequency fdm. In some embodiments, the frequencies of the first to third interval signals fd1-I,Q to fd3-I,Q are the first, second, and third intervallic frequencies fd1-fd3 shown in FIG. 2A, or 1584 MHz, 3168 MHz and 6336 MHz, respectively. In other words, the intervallic frequency generator 302 performs step 212 of FIG. 2C.

The PLL 304 generates an initial in-phase signal f0-I and an initial quadrature signal f0-Q with frequencies both equal to the second frequency f2 (i.e. 3960 MHz) and differing in phase by 90°.

The first mixer 306 performs a selective frequency mixing procedure on the initial signal f0-I,Q (with frequency=the second intervallic frequency f2=3960 MHz) received from the PLL 304 and the fourth interval signal fd4-I,Q (with frequency=the fourth intervallic frequency fd4=528 MHz) received from the intervallic frequency generator 302 to generate a first output in-phase signal fo1-I and a first output quadrature signal fo1-Q with equal frequencies but differing in phase by 90° (collectively referred to as a first output signal fo1-I,Q). The frequency of the first output signal fo1-I,Q, referred to as the first output frequency fo1, may be selected as the first frequency f1 (=f2−fd4=3960 MHz−528 MHz=3432 MHz), the third frequency f3 (=f2+fd4=3960 MHz+528 MHz=4488 MHz), or the frequency of the initial frequency f01-I,Q (=f2=3960 MHz), as shown in FIG. 2A. In other words, the phase locked loop 304 and the first mixer 306 collectively perform step 214 in FIG. 2C.

The second mixer 308 performs a frequency mixing procedure on the first output signal fo1-I,Q received from the first mixer 306 and the intervallic output signal fdo-I,Q to generate a second output in-phase signal fo2-I and a second output quadrature signal fo2-Q with equal frequencies but differing in phase by 90° (collectively referred to as a second output signal fo2-I,Q). The frequency of the second output signal fo2-I,Q, referred to as the second output frequency fo2 is equal to (fo1-fdo). As such, when (fo1,fdo) is selected as (f1,fd1), (f2,fd1), (f3,fd1), (f1,fd2), (f2,fd2), (f3,fd2), (f1,fd3), (f2,fd3), and (f3,fd3), the second output frequency fo2 is f4, f5, f6, f7, f8, f9, f13, f14 and f15 of FIG. 2A, respectively. In summary, when the intervallic output signal fdo-I,Q generated by the intervallic frequency generator 302 is the first interval signal fd1-I,Q (i.e. fdo=fd1=1584 MHz), the second output frequency fo2 belongs to the second frequency group Group2, that is, one of f4, f5, and f6; when the intervallic output signal fdo-I,Q generated by the intervallic frequency generator 302 is the second interval signal fd2-I,Q (i.e. fdo=fd2=3168 MHz), the second output frequency fo2 belongs to the third frequency group Group3, that is, one of f7, f8, and f9; when the intervallic output signal fdo-I,Q generated by the intervallic frequency generator 302 is the third interval signal fd3-I,Q (i.e. fdo=fd3=6336 MHz), the second output frequency fo2 belongs to the fifth frequency group Group5, that is, one of f13, f14, and f15. In other words, the second mixer 308 performs step 216 of FIG. 2C.

The third mixer 310 performs a frequency mixing procedure on the second output signal fo2-I,Q received from the second mixer 308 and the first interval signal fd1-I,Q when the second output frequency fo2 belongs to the fifth Group5, to generate a third output in-phase signal fo3-I and a third output quadrature signal fo3-Q with equal frequencies but differing in phase by 90° (collectively referred to as a third output signal fo3-I,Q). The frequency of the third output signal fo3-I,Q, referred to as the third output frequency fo3 hereafter, is equal to (fo2-fd1). As such, when the second output frequency fo2 is f13, f14 and f15 shown in FIG. 2A, the third output frequency fo3 is equal to f10, f11 and f12, respectively. In other words, the third mixer 310 performs step 218 of FIG. 2C.

The multiplexer 312 receives the first, second and third output frequencies fo1-I,Q, fo2-I,Q and fo3-I,Q to select one as a final output signal ff-I,Q (with frequency referred to as a final output frequency ff). In this way, the final output frequency ff is one of the first to fourteenth frequencies f1-f14 selectively. Note that because the fifteenth frequency f15 falls outside the MB-OFDM UWB band, even when the second output frequency fo2 is selected to be the fifth frequency f15, the multiplexer 312 does not select the second output frequency fo2 as the final output frequency ff. The multiplexer 312 performs step 22 of FIG. 2C.

It should be understood that the first, second and third mixer 306, 308, and 310 are four-phase mixers. This means that the initial signal f0-I,Q, the first to third output signals fo1-I,Q to fo3-I,Q, the first to fourth interval signal fd1-I,Q to fd4-I,Q and the intervallic output signal fdo-I,Q, all have (+) and (−) phases. For example, the second in-phase signal f2-I represent a signal in (+) phase (denoted as f2-I(+)) and a signal in (−) phase (denoted as f2-I(−)). Similarly, the second quadrature signal f2-Q represent a signal in (+) phase (denoted as f2-Q(+)) and a signal in (−) phase (denoted as f2-Q(−)).

Figure 4:
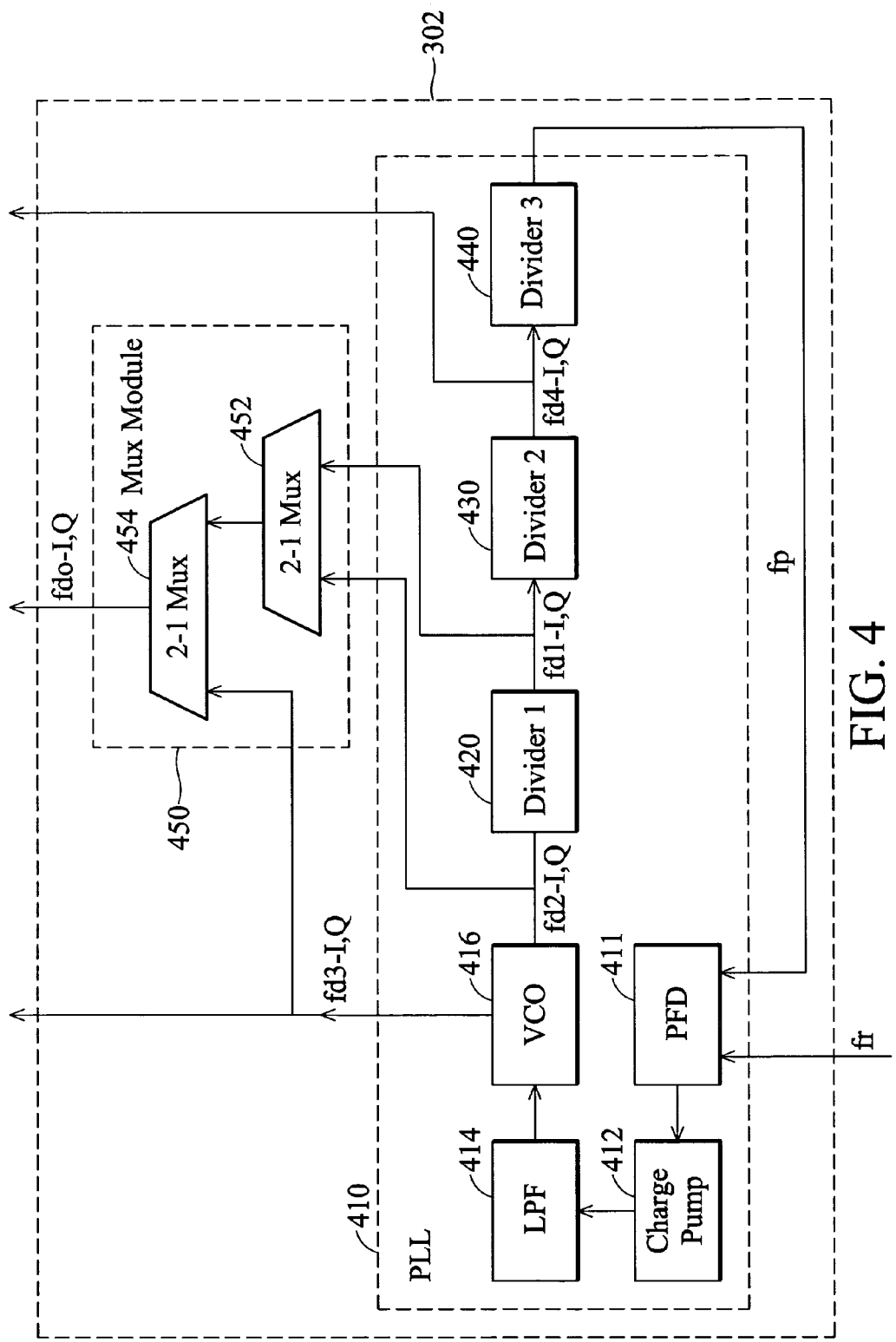
FIG. 4 is a block diagram of the intervallic frequency generator 302 in accordance with an embodiment of the invention.
Figure 6:
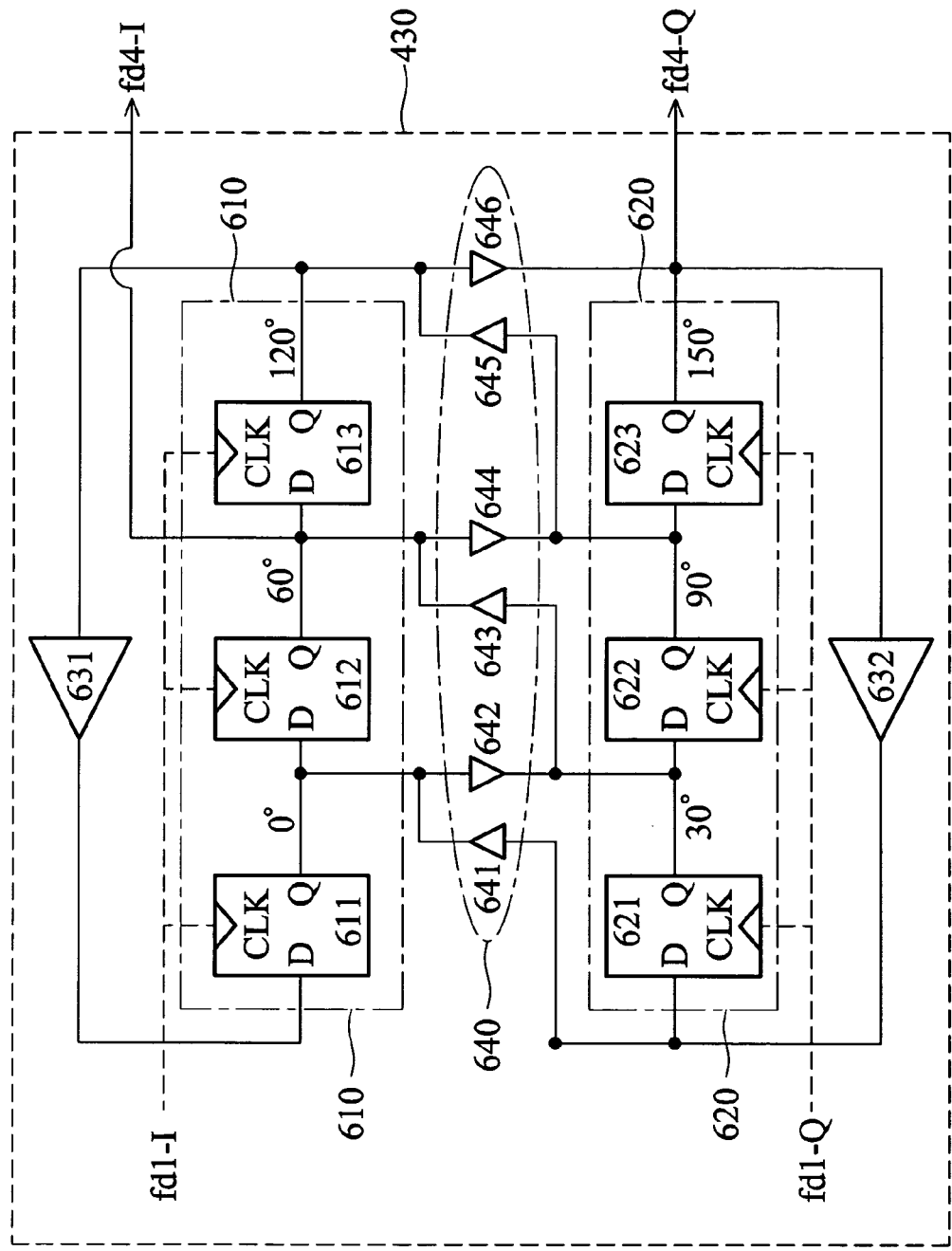
FIG. 6 is a schematic diagram of the second divider of FIG. 4 in accordance with an embodiment of the invention.

Additionally, it should be understood that schematic diagrams shown in FIGS. 4 and 6 are illustrated as single-ended structures but are practically differential structures. Those skilled in the art should readily deduce from a single-ended structure to its corresponding differential structure.

FIG. 4 is a block diagram of the intervallic frequency generator 302 in accordance with an embodiment of the invention. As shown, the frequency generator 302 comprises a phase locked loop (PLL) 410 and a multiplexer module 450. The phase locked loop (PLL) 410 comprises a phase frequency detector (PFD) 411, a charge pump 412, a low pass filter 414, a voltage controlled oscillator (VCO 416), and first to third dividers 420, 430 and 440, all connected in series.

The PFD 411 receives a reference frequency Sfr having a reference frequency (e.g. 66 MHz) and a feedback signal fp having a feedback frequency. The VCO 416 generates the second and third differential signals fd2-I,Q and fd3-I,Q.

The first divider 420 divides the second frequency fd2 received from the VCO 416 by a first integer N1 (e.g. 2) to generate the first interval signal fd1-I,Q with frequency fd1=fd2/N1.

The second divider 430 divides the first frequency fd1 received from the first divider 420 by a second integer N2 (e.g. 3) to generate the fourth interval signal fd4-I,Q with frequency fd4=fd1/N2.

The third divider 440 divides the fourth frequency fd4 received from the second divider 430 by a third integer N3 (e.g. 8) to generate the feedback signal fp with frequency=fd4/N3.

The multiplexer module 450 receives the first to third interval signals fd1-I,Q-fd3-I,Q and selects one thereof as the intervallic output signal fdo-I,Q. The multiplexer module 450, for example, may comprise two 2 to 1 multiplexers 452 and 454.

Figure 5:
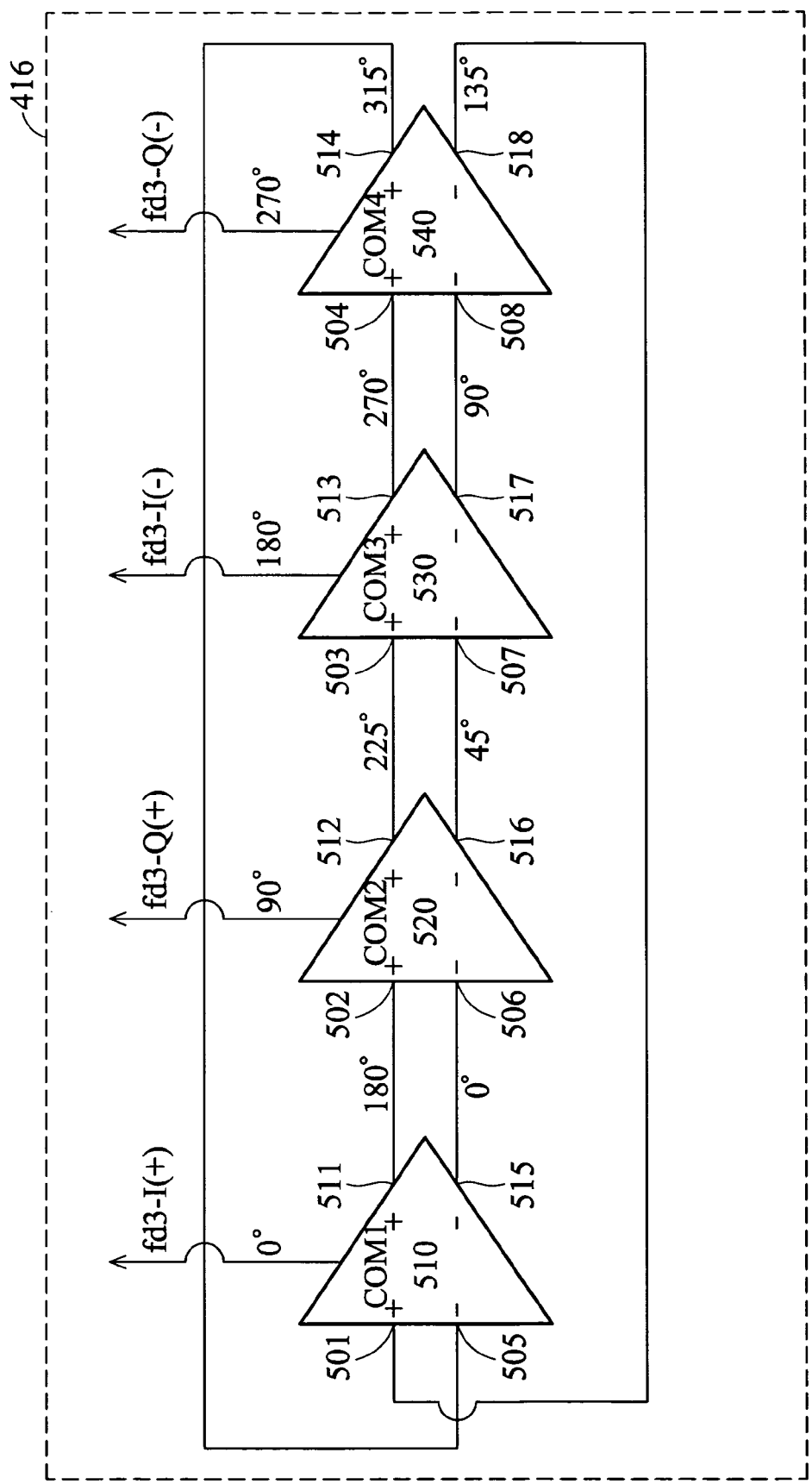
FIG. 5 is a schematic diagram of a VCO of FIG. 4 in accordance with an embodiment of the invention.

FIG. 5 is a schematic diagram of the VCO 416 of FIG. 4 in accordance with an embodiment of the invention. Conventionally, a VCO operates at 6336 MHz and then 3168 MHz is generated by dividing the 6336 MHz. However, this consumes considerable circuit area and power. To solve this problem, the invention cuts the operating frequency of the VCO 416 in half and obtains a doubled frequency from a common-mode node of the VCO 416. As shown, the VCO 416 comprises four differential delay cells 510, 520, 530 and 540 connected in series, having (+) inputs 501-504, (−) inputs 505-508, (+) outputs 511-514, (−) outputs 515-518, and common-mode nodes COM1-COM4. The (+) outputs 511-514 generate phases of 180°, 225°, 270°, and 315°, respectively. The (−) output 515-518 generate phases of 0°, 45°, 90°, and 135°, respectively. The low pass filter 414 generates a DC voltage controlling the operation of the VCO 416 to generate 8-phase signals. Simultaneously, the common-mode nodes COM1-COM4 generate 4-phase signals with half frequency of the 8-phase signals. More specifically, the common-mode nodes COM1-COM4 generate signals with phases of 0°, 90°, 180°, and 270°, respectively acting as fd3-I(+), fd3-Q(+), fd3-I(−), and fd3-Q(−). The structure of the differential delay cells 510, 520, 530 and 540 should be well known to those skilled in the art and thus detailed description thereof is omitted here for brevity.

In one embodiment, the VCO in PLL 304 (not shown by a figure) may also be implemented with FIG. 5, with the only modifications being that the (+) and (−) inputs of the second differential delay cell 520 receive (+) and (−) phases of a signal of a frequency half of the initial frequency f0 (i.e. 1980 MHz) and common-mode nodes COM1-COM4 generates f0-I(+), f0-Q(+), f0-I(−), and f0-Q(−).

FIG. 6 is a schematic diagram of the second divider 430 of FIG. 4 in accordance with an embodiment of the invention. The divider of the figure is a four-phase divide-by-3 divider. As shown, the second divider 430 comprises a first oscillator 610 comprising first to third D flip-flops 611-613, a second oscillator 620 comprising fourth to sixth D flip-flops 621-623, a first inverter 631 coupled between an output Q of the third D flip-flop 613 and an input of the first D flip-flop 611, a second inverter 632 coupled between an output Q of the sixth D flip-flop 623 and an input of the fourth D flip-flop 621, and a phase alignment buffer 640 disposed between the first and second oscillators 610 and 620 and comprising first to sixth buffers 641-646.

The first and second oscillators 610 and 620 generate I and Q phases of the fourth interval signal (fd4-I and fd4-Q) respectively, according to the injection lock mechanism. In the first oscillator 610, a clock input CLK of the first D flip-flop 611 receives the I phase of first interval signal (fd1-I), and outputs Q of the first to third D flip-flops 611-613 respectively provide phases of 0°, 60°, and 120°. An output signal sent out at the output Q of the third D flip-flop 613 is fed back to an input D of the first D flip-flop 611 through the first inverter 631. An output signal sent out at the output Q of the second D flip-flop 612 thus serves as the I phase of the fourth interval signal (fd4-I). Similarly, in the second oscillator 620, a clock input CLK of the fourth D flip-flop receives the Q phase of first interval signal (fd1-Q), and outputs Q of the fourth to sixth D flip-flops 621-623 respectively provides phases of 30°, 90°, and 150°. An output signal sent out at the output Q of the sixth D flip-flop 623 is fed back to an input D of the fourth D flip-flop 621 through the second inverter 632. An output signal sent out at the output Q of the sixth D flip-flop 623 thus serves as the Q phase of the fourth interval signal (fd4-Q). The phase alignment buffer 640 is implemented to ensure accurate phase alignment of the I and Q phases of the fourth interval signals (fd4-I and fd4-Q).

Note that in practice, the first and second inverter 631 and 632 are not present in the second divider 432 because a single-ended structure is illustrated in the figure and a real differential structure simultaneously generates differential signals.

Most conventional divide-by-3 dividers have disadvantages such as serious distortion of duty cycle, no production of 4-phase signals and hence outputs cannot be provided to an SSB mixer. Miller dividers proposed for solving these problems also face serious spur effect due to the match limit inside a chip. The second divider 430, however, not only provides a 50% duty cycle but also produces four phases to the first mixer 306. Moreover, the four phases are aligned accurately, preventing high spur component of the first output frequency fo1 provided by the first mixer 306.

Figure 7:
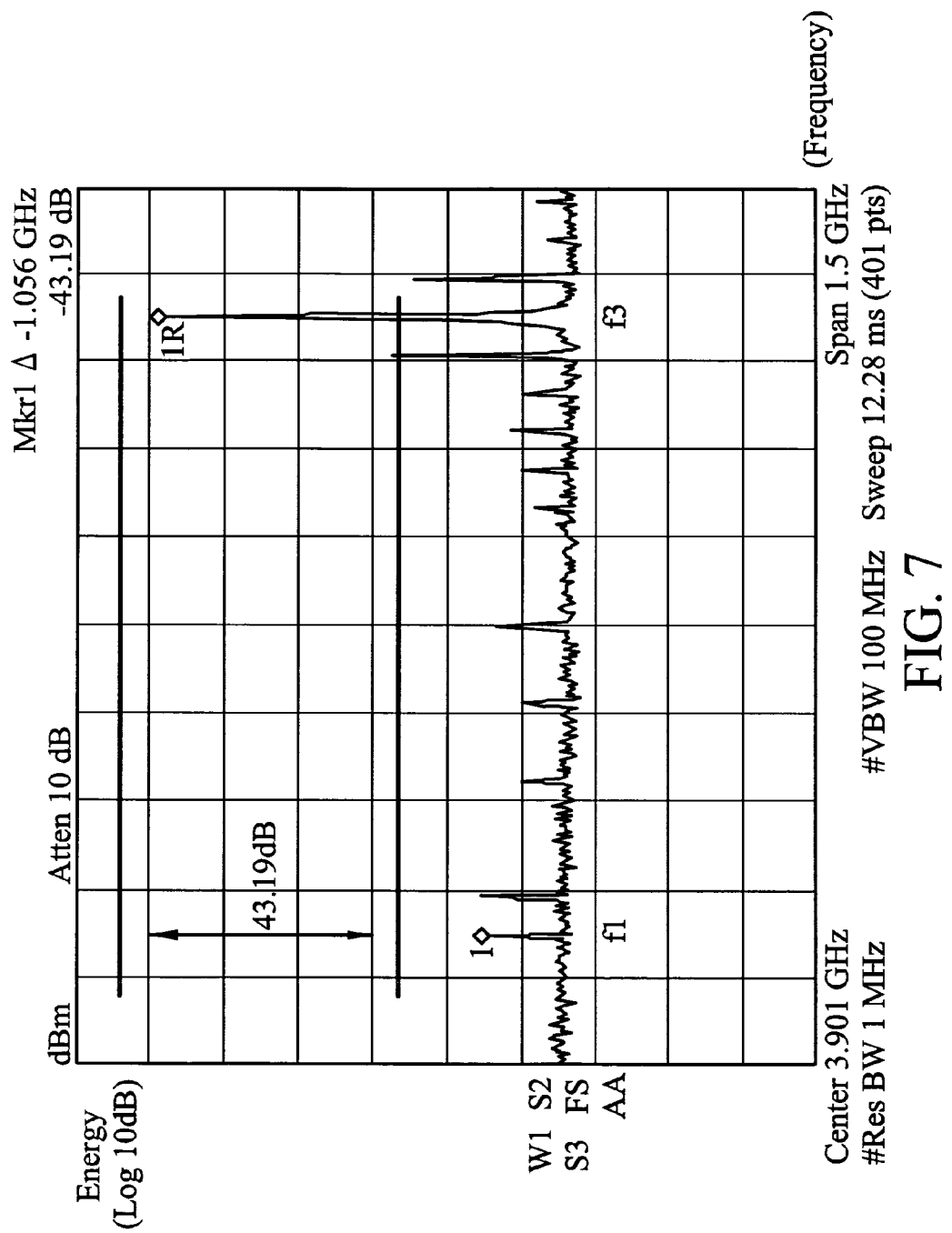
FIG. 7 shows relationship between the energy and frequency of the first output signal.

FIG. 7 shows the relationship between the energy and frequency of the first output signal fo1-I,Q when the first output frequency fo1 is selected as the third frequency f3 (4488 MHz) in an embodiment applying the second divider 430 of FIG. 6. As shown, the energy of the first output frequency fo2 at f3 (4488 MHz) exceeds that at f1 by more than 40 dB. In other words, more than 40 dB spur is suppressed.

Figure 8A:
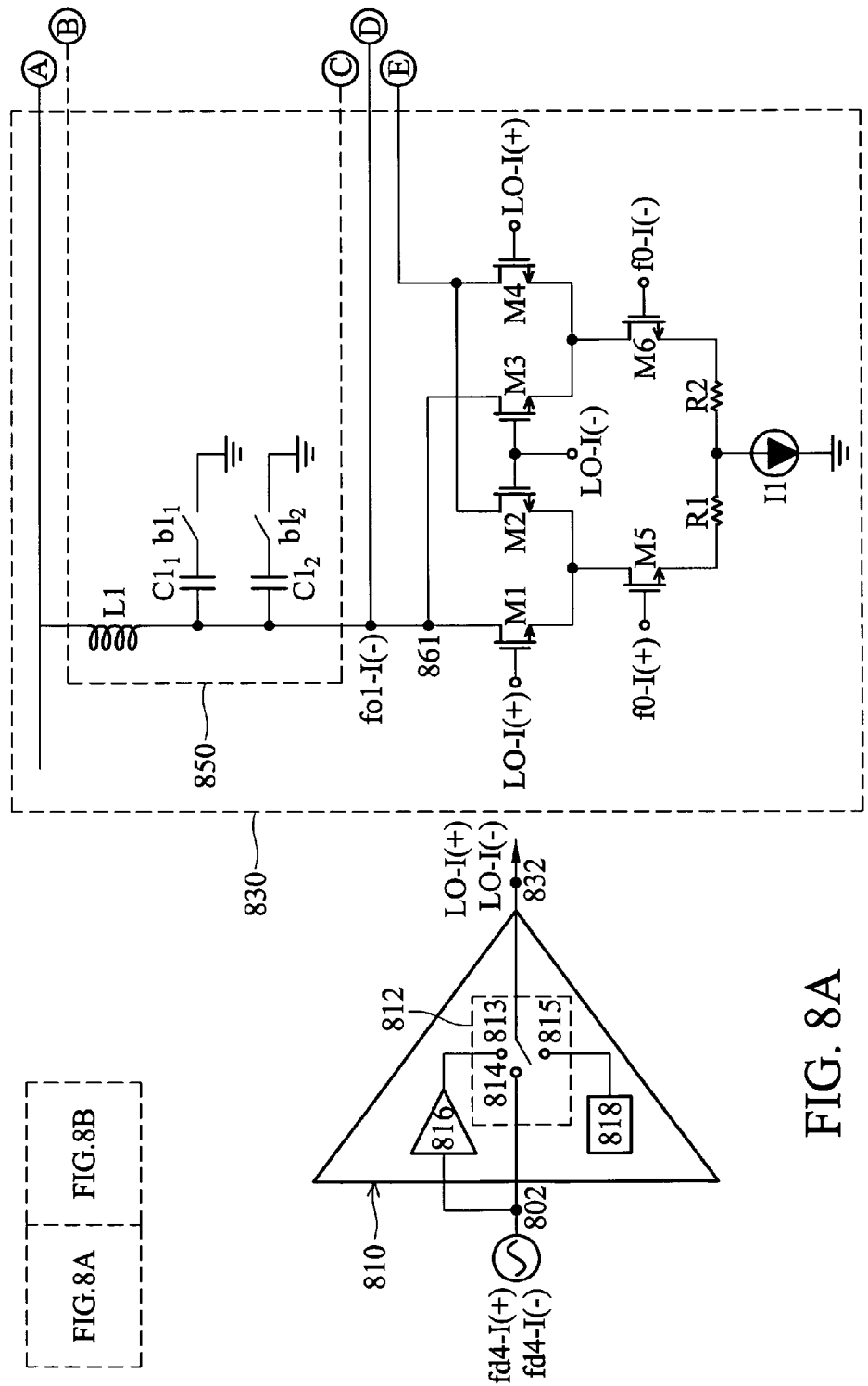
FIGS. 8A and 8B are collectively a schematic diagram of the first mixer of FIG. 3 in accordance with an embodiment of the invention.
Figure 8B:
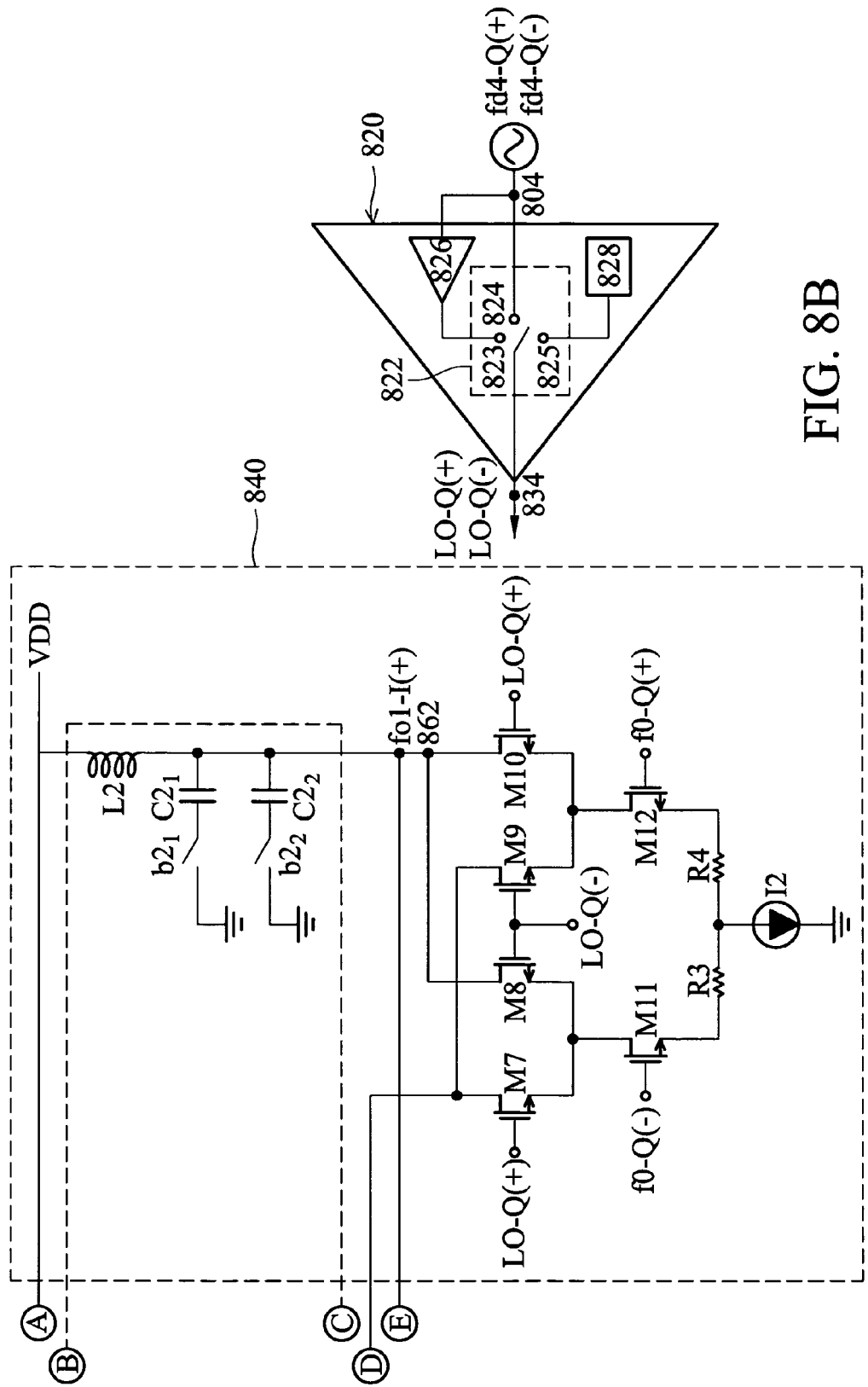

FIGS. 8A and 8B are collectively a schematic diagram of the first mixer 306 of FIG. 3 in accordance with an embodiment of the invention. Conventional single side band (SSB) mixer can be utilized because the frequency range of the first output signal fo1-I,Q is that of the first frequency range Group1. As shown, the first mixer 306 comprises first and second three-state buffers 810 and 820 and first and second mixing circuits 830 and 840. The first and second mixing circuits 830 and 840 act collectively as a SSB mixer. Note that a SSB mixer can have various structures. This is an exemplary embodiment and the invention is thus not limited thereto.

The first three-state buffer 810 has an input 802 receiving I(+) and I(−) phases of the fourth interval signal (fd4-I(+) and fd5-I(−)), an output 832 providing I(+) and I(−) phases of a mixing signal (LO-I(+) and LO-I(−)), a switch 812 having first to third nodes 813-815, a inverter 816 and a DC voltage source 818 providing a DC voltage level. When the switch 812 is switched to the first node 813, the second node 814 and the third node 815, the in-phase mixing signal LO-I (comprising LO-I(+) and LO-I(−)) is the I(−) phase of the fourth interval signal (fd4-I(−)), the I(+) phase of the fourth interval signal (fd4-I(+)), and the DC voltage level, respectively. Similarly, the second three-state buffer 820 has an input 804 receiving Q(+) and Q(−) phases of the fourth interval signal (fd4-Q(+) and fd4-Q(−)), an output 834 providing Q(+) and Q(−) phases of a mixing signal (LO-Q(+) and LO-Q(−)), a switch 822 having first to third node 823-825, a inverter 826 and a DC voltage source 828 providing a DC voltage level. When the switch 822 is switched to the first node 823, the second node 824 and the third node 825, the quadrature mixing signal LO-Q (comprising LO-Q(+) and LO-Q(−)) is the Q(−) phase of the fourth interval signal (fd4-Q(−)), the Q(+) phase of the fourth interval signal (fd4-Q(+)), and the DC voltage level, respectively.

The first mixing circuit 830 comprises first to sixth NMOS transistors M1-M6, first and second transistors R1, R2 connected to a first current source I1, a first inductor L1 connected to a DC voltage source VDD and first and second capacitors $C1_1$ and $C1_2$ respectively connected to first and second capacitor switches $b1_1$ and $b1_2$. The first and fourth NMOS transistors M1 and M4 have gates receiving I(+) phase of the mixing signal (LO-I(+)). The second and third NMOS transistors M2 and M3 have gates receiving I(−) phase of the mixing signal (LO-I(−)). The fifth and sixth NMOS transistors M5 and M6 have gates respectively receiving I(+) and I(−) phases of the initial signal (f0-I(+), f0-I(−)). Similarly, the second mixing circuit 840 comprises seventh to twelfth NMOS transistors M7-M12, third and fourth transistors R3, R4 connected to a second current source I2, a second inductor L2 connected to the DC voltage source VDD and third and fourth capacitors $C2_1$ and $C2_2$ respectively connected to third and fourth capacitor switches $b2_1$ and $b2_2$. The seventh and tenth NMOS transistors M7 and M10 have gates receiving Q(+) phase of the mixing signal (LO-Q(+)). The eighth and ninth NMOS transistors M8 and M9 have gates receiving Q(−) phase of the mixing signal (LO-Q(−)). The eleventh and twelfth NMOS transistors M11 and M12 have gates respectively receiving Q(−) and Q(+) phases of the initial signal (f0-Q(+), f0-Q(−)). First and second mixing in-phase outputs 861 and 862 provide the I(−) and I(+) phases of the first output signal (fo1-I(−), fo1-I(+)).

The first and second inductors L1 and L2, the first to fourth capacitors $C1_1$, $C1_2$, $C2_1$, $C2_2$ and the first to fourth capacitor switches $b1_1$, $b1_2$, $b2_1$ and $b2_2$ construct a inductance-capacitance tank (LC tank) 850 for amplifying optionally the first output signal fo1-I,Q. When the frequency of first output signal fo1-I,Q is f1 (3432 MHz), f2 (3960 MHz) and f3 (4488 MHz), the states of he first to fourth capacitor switches $b1_1$, $b1_2$, $b2_1$ and $b2_2$, ($b1_1$, $b1_2$, $b2_1$, $b2_2$), is (1,1,1,1), (1,0,1,0) (or (0,1,0,1)), and (0,0,0,0), respectively, where "0" and "1" respectively denote turning off and turning on of one capacitor switch. The first and second mixing circuits 830 and 840 have conventional structures, thus operation thereof should be well-known to those skilled in the art and description thereof is omitted for brevity.

The third mixer 310, similar to the first mixer 306, has an output frequency range covering only that of the fourth frequency group Group4. The third mixer 310 may thus be implemented as a conventional SSB mixer. FIG. 8 can be applied as the third mixer 316 with only a small modification by removing the first and second three-state buffers 810 and 820.

Figure 9:
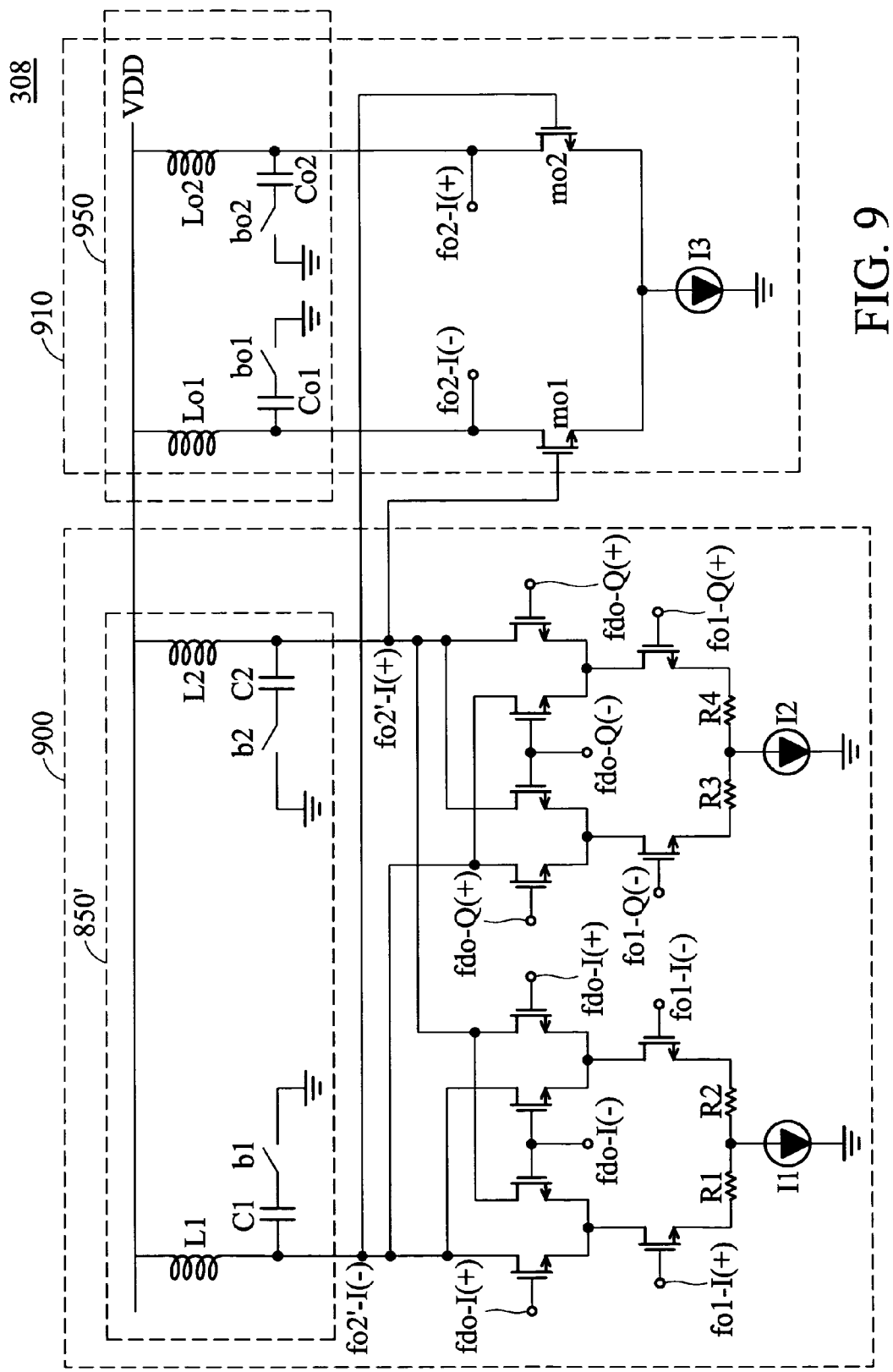
FIG. 9 is a schematic diagram of the second mixer of FIG. 3 in accordance with an embodiment of the invention.

FIG. 9 is a schematic diagram of the second mixer 308 of FIG. 3 in accordance with an embodiment of the invention. Sufficiently high selectivity is required to reduce spur effect because the output frequency range covers the second, third, and fifth frequency groups Group2, Group3 and Group5 to achieve up to 6 GHz. Conventional parallel or series connection peaking technique provides broad and flat gain. However, it is incapable of providing high gain and high selectivity. Using a single inductance-capacitance tank (LC tank) instead provides sufficient gain by switching capacitors. However, the quality factor of the LC tank decreases with a decrease in frequency, further causing decrease of gain and selectivity. To solve the problem, two LC tanks connected in series are used in the second mixer 308.

As shown in the figure, the second mixer 308 comprises a single side band (SSB) mixing circuit 900 and an output circuit 910. The SSB mixing circuit 900 differs from the first mixer 306 only in lacking the first and second three-state buffer 810 and 820 and having the LC tank 850' replacing the LC tank 850. The LC tank 850' differs from the LC tank 850 only in that the first to fourth capacitors $C1_1$, $C1_2$, $C2_1$ and $C2_2$ in LC tank 850 are replaced with first and second capacitors C1 and C2 in LC tank 850' and the first to fourth capacitor switches $b1_1$, $b1_2$, $b2_1$ and $b2_2$ in LC tank 850 are replaced with first and second capacitor switches b1 and b2 in LC tank 850'. The output circuit 910 comprises first and second NMOS output transistors mo1 and mo2, a LC tank 950 and a third current source I3. Note that various structures can be implemented as the SSB mixing circuit 900.

The first and second NMOS output transistors mo1 and mo2 have sources connected to the third current source I3, gates connected respectively to I(+) and I(−) phases of a mixing output signal (fo2'-I(+) and fo2'-I(−)), and drains respectively providing the I(+) and I(−) phases of the second output signal (fo2-I(+) and fo2-I(−)). The LC tank 950, similar to the LC tank 850', comprises first and second output inductors Lo1 and Lo2 and first and second output capacitors Co1 and Co2 respectively connecting to first and second output capacitor switches bo1 and bo2. LC tank 950 further amplifies the I(+) and I(−) phases of the mixing output signal (fo2'-I(+) and fo2'-I(−)) to generate the I(+) and I(−) phases of the second output signal (fo2-I(+) and fo2-I(−)).

Turning on or off of the capacitor switches b1 and b2 in LC resonance tank 850' and the capacitor switches bo1 and bo2 in LC resonance tank 950 can be programmed such that a sufficiently broad and flat gain is achieved in a particular frequency range. In some embodiments, when the second output frequency fo2 is of the fifth frequency group Group5, the third frequency group Group3, and the second frequency Group2, the state of the four capacitor switches b1, b2, bo1, bo2, denoted as (b1, b2, bo1, bo2), is (0,0,0,0), (0,0,1,1) and (1,1, 1,1), respectively, where "0" and "1" respectively denote turning off and turning on of a capacitor switch. In the embodiment of the figure, gain variation (defined as difference between the maximum and minimum gains) can be reduced down to 3 dB in the frequency range of each frequency group (Group5, Group3, or Group2), and can decays at a rate of −80 dB/decade.

Figure 10A:
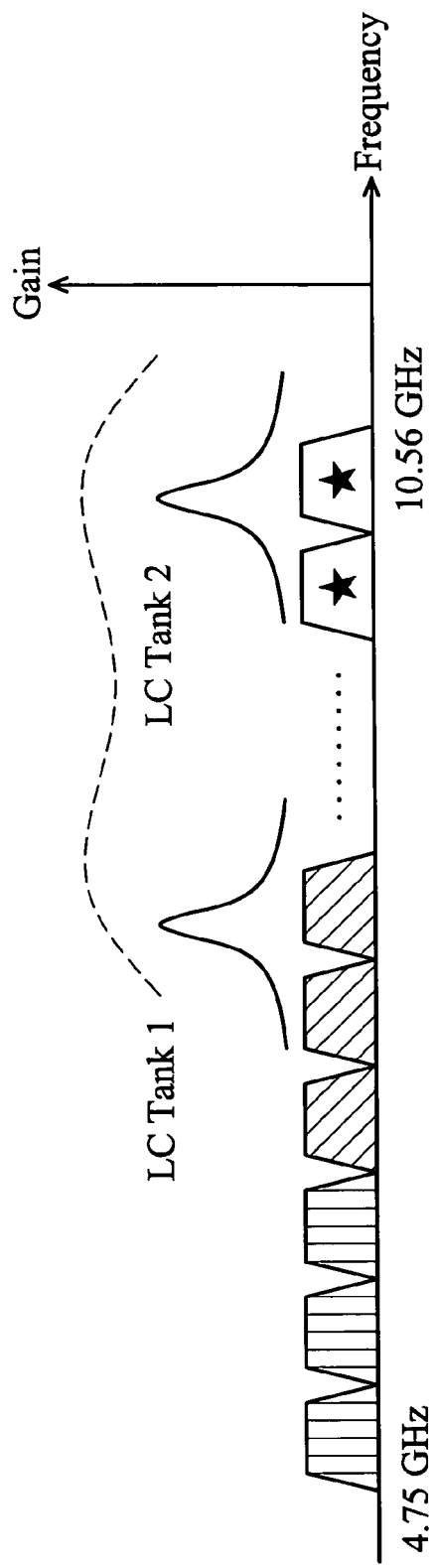
FIGS. 10A, 10B and 10C show frequency response diagrams of resonance tanks of FIG. 9.
Figure 10B:
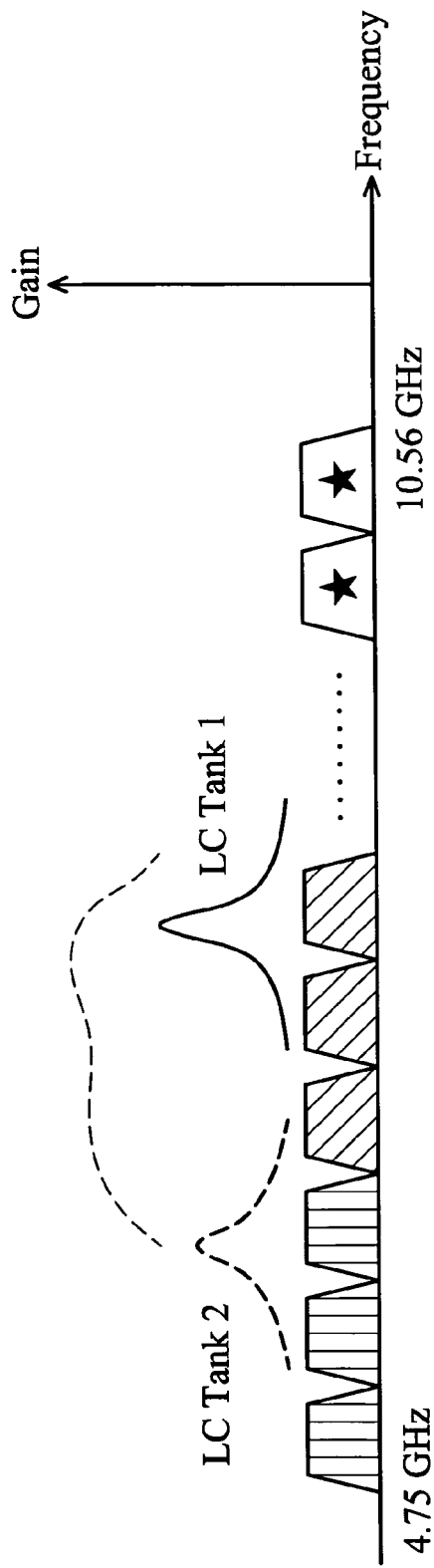
Figure 10C:
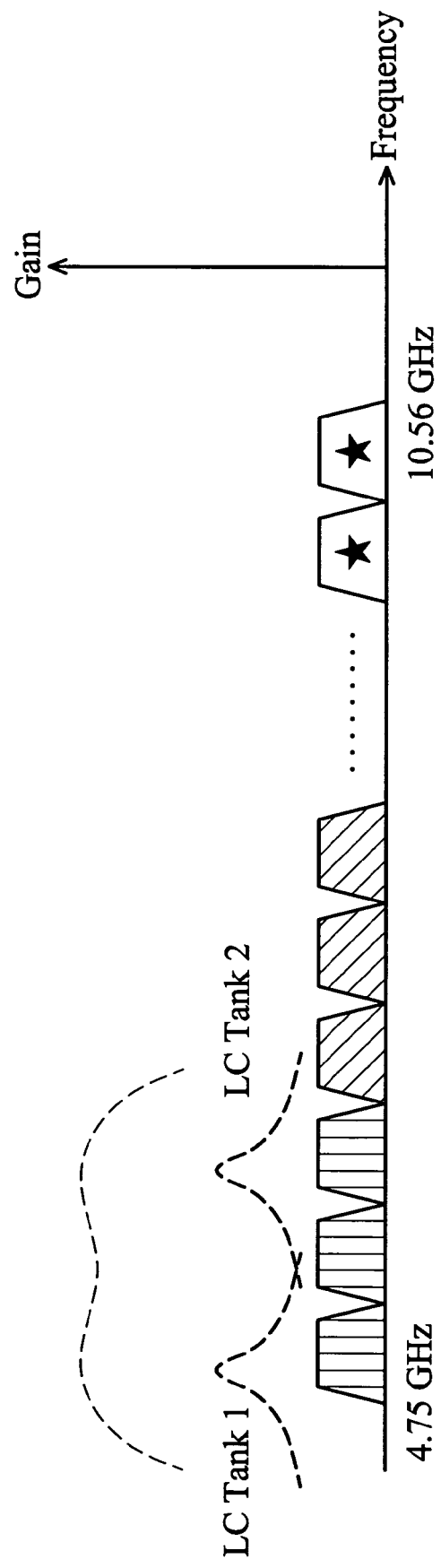

FIGS. 10A, 10B and 10C shows respectively frequency response diagrams of the resonance tanks 850' and 950 when the second output frequency fo2 is of the fifth frequency group Group5, the third frequency group Group3, and the second frequency Group2. As shown, the response peak of the resonance tanks 850' and 950 approaches with decrease in frequency. In this way, quality factor reduction and thus gain and selectivity degradation due to frequency decrease can be compensated.

Figure 11:
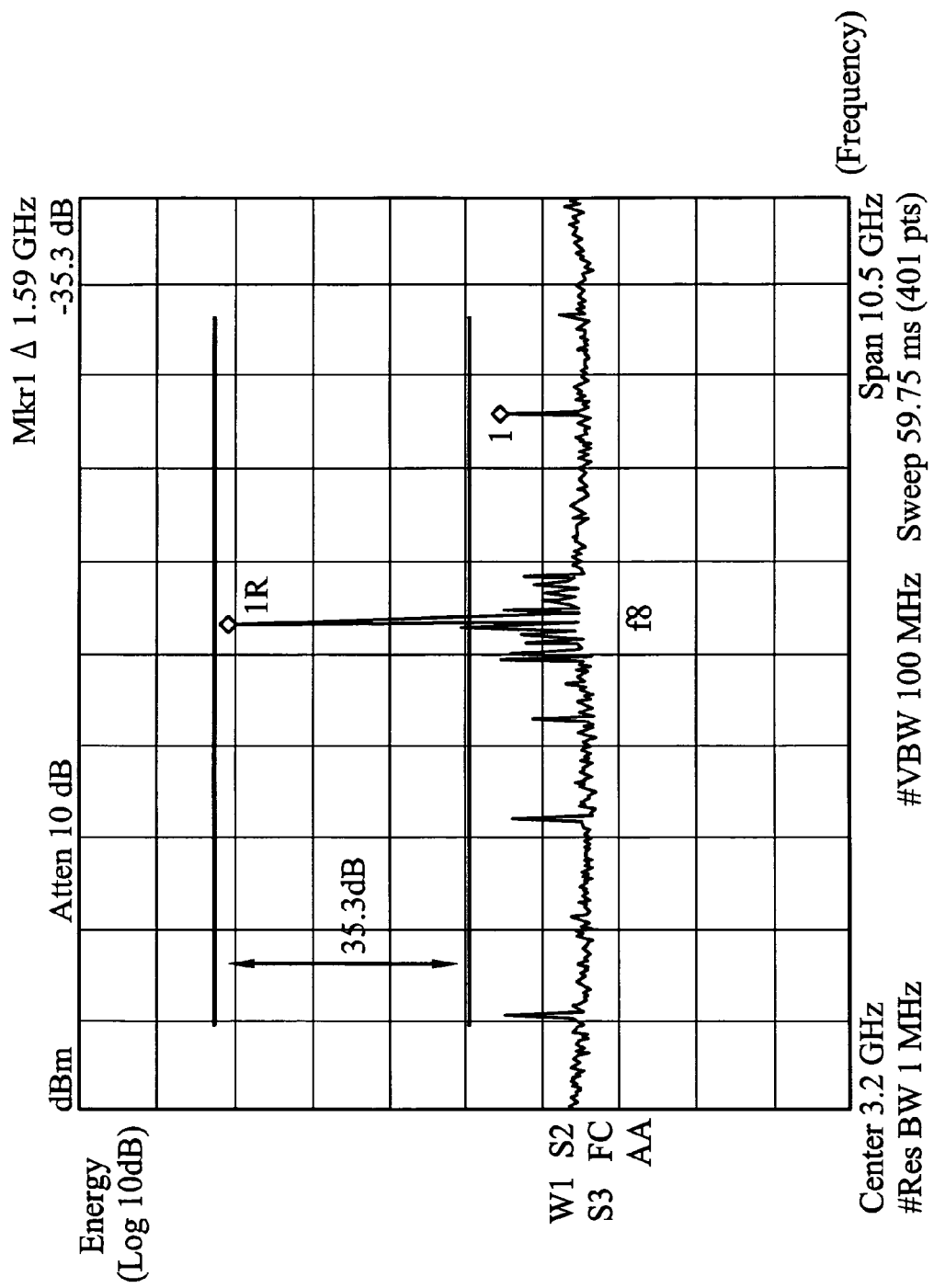
FIG. 11 shows the relationship between the energy and frequency of the second output signal.

FIG. 11 shows the relationship between the energy and frequency of the second output signal fo2-I,Q when the second output frequency fo2 is selected as the central frequency of the third frequency Grounp3 (i.e. f8, or 7128 MHz) in an embodiment where the second mixer 308 of FIG. 9 is applied. As shown, the energy of the second output frequency fo2 at f8 (7129 MHz) exceeds that of spurs elsewhere by more than 35 dB.

The frequency synthesizer 300 of the invention uses only two PLLs to generate the first to fourteenth frequencies f1 to f14. Hardware burden is not thus heavier compared to conventional technologies. Additionally, conventional voltage controlled oscillators and dividers are not suitable for generating four-phase signals used in the conventional SSB mixer. The invention, however, has conquered difficulties in voltage controlled oscillator and divider designs. Furthermore, the frequency-doubling technique is applied to reduce power consumption of the two PLLs. Also, a four-phase divide-by-3 divider with high phase accuracy is proposed for implementation as the second divider 430 to reduce spurs of the first output signal fo1-I,Q generated by the first mixer 306. Furthermore, second mixer 308 having LC resonance tanks 850' and 950 is disclosed to cover a broader frequency range. Furthermore, and most importantly, the first-order spurs generated by the second and third mixer 308 and 310 falls outsides the range of UWB bands, thus alleviating spur accumulation due to serial connection of three mixers 306, 308, and 310. The switching time of the frequency synthesizer 300 can be reduced to less than 3 ns (not shown with a figure).

Table. 1. compares the frequency synthesizer 300 of the invention with several conventional frequency synthesizers. As shown, frequency synthesizer 300 can be manufactured with the 0.18 μm process. The frequency synthesizer 300 with only two PLLs and 160 mW power consumption generates fourteen bands, which is much greater than the number generated by conventional technologies. Additionally, the invention has other advantages such as good spur suppression (more than 35 dB) and ability to offer four-phase signals.

TABLE 1

| | Conventional technology [1] | Conventional technology [2] | Conventional technology [3] | Conventional technology [4] | The invention |
|---|---|---|---|---|---|
| Process | 0.18 μm CMOS | 0.18 μm CMOS | 0.18 μm CMOS | 0.25 μm SiGe CMOS | 0.18 μm CMOS |
| PLL Number | 2 | 0 outside chip | 1 | 2 | 2 |
| Band Number | 7 | 3 | 7 | 3 | 14 |
| Spur suppression | >37 dB | >15 dB | undescribed | >35 dB | >35 dB |
| Generating 4-phase signals? | No | No | No | Yes | Yes |
| Power consumption | 48 mW | 18 mW | 178 mW | 73 mW | 160 mW |

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency synthesizing method for generating a plurality frequencies in a multi-band orthogonal frequency division multiplexing (MB-OFDM) ultra wideband (UWB) system, the frequencies comprising first to fourteenth frequencies from low to high, any two neighboring thereof separating by a basic intervallic frequency, the method comprising:
   classifying the frequencies into first to fifth frequency groups respectively comprising the first to third frequencies, the fourth to sixth frequencies, the seventh to ninth frequencies, tenth to twelfth frequencies, and the thirteenth to fourteenth frequencies;
   generating the first frequency group;
   performing a first frequency mixing procedure on the first frequency group to generate the second, third and fifth frequency groups; and
   performing a second frequency mixing procedure on the fifth frequency group to generate the fourth frequency group.

2. The method as claimed in claim 1, wherein generation of the first frequency group comprises:
   generating the second frequency;
   generating a fourth intervallic frequency equal to the basic intervallic frequency; and
   performing a selective frequency mixing procedure on the second frequency and the fourth intervallic frequency to generate the first frequency group.

3. The method as claimed in claim 1, wherein performing of the first frequency mixing procedure on the first frequency group to generate the second, third and fifth frequency groups comprises:
   generating first to third intervallic frequencies all integers times the basic intervallic frequency; and
   mixing the first frequency group with the first, second and third intervallic frequencies to generate the second, third and fifth frequency groups, respectively.

4. The method as claimed in claim 3, wherein the first to third intervallic frequencies are 3, 6 and 12 times the basic intervallic frequency, respectively.

5. The method as claimed in claim 1, wherein performing of the second frequency mixing procedure on the fifth frequency group to generate the fourth frequency group comprises:
   generating a first intervallic frequency integer times the basic intervallic frequency; and
   mixing the fifth frequency group with the first intervallic frequency to generate the fourth frequency group.

6. The method as claimed in claim 5, wherein the first intervallic frequency is 3 times the basic intervallic frequency.

7. A frequency synthesizing method for generating a plurality frequencies in a multi-band orthogonal frequency division multiplexing (MB-OFDM) ultra wideband (UWB) system, the frequencies comprising first to fifteenth frequencies from low to high, any two neighboring frequencies separated by a basic intervallic frequency, the method comprising:
   generating first to third intervallic frequencies with magnitudes in ascending order and all integers times the basic intervallic frequency and selecting one thereof as an intervallic output frequency;
   generating one of the first to third frequency as a first output frequency;
   mixing the first output frequency and the intervallic output frequency to generate a second output frequency, the second output frequency being one of the fourth to ninth frequencies, thirteenth to fourteenth frequencies, and fifteenth frequency; and mixing the second output frequency with the first intervallic frequency to generate the third output frequency, the third output frequency being one of the tenth to twelfth frequencies.

8. The method as claimed in claim 7, wherein the first to third intervallic frequencies are 3, 6 and 12 times the basic intervallic frequency, respectively.

9. The method as claimed in claim 7, wherein generation of one of the first to third frequency as the first output frequency comprises:
generating the second frequency;
generating a fourth intervallic frequency equal to the basic intervallic frequency; and
performing a selective frequency mixing procedure on the second frequency and the fourth intervallic frequency to generate one of the first to third frequency as the first output frequency.

10. The method as claimed in claim 7, wherein generation of the second frequency uses a phase locked loop.

11. The method as claimed in claim 7, wherein the first to third intervallic frequencies are 3, 6 and 12 times the basic intervallic frequency, respectively.

12. The method as claimed in claim 7, wherein generation of the first to third intervallic frequencies comprises:
generating the second and third intervallic frequencies; and
dividing the second frequency by a first integer to generate the first intervallic frequency.

13. The method as claimed in claim 12, wherein generation of the second and third intervallic frequencies uses an eight-phase oscillator to generate the second and third intervallic frequencies each having four phases.

14. The method as claimed in claim 9,
wherein generation of the first to third intervallic frequencies comprises:
generating the second and third intervallic frequencies; and
dividing the second frequency by a first integer to generate the first intervallic frequency; and
wherein generation of the fourth intervallic frequency comprises dividing the first intervallic frequency by a second integer to generate the fourth intervallic frequency.

15. The method as claimed in claim 12, wherein the first integer is 2.

16. The method as claimed in claim 14, wherein the first and second integers are 2 and 3 respectively.

17. The method as claimed in claim 9, wherein a single side band mixer is used to perform the selective frequency mixing procedure.

18. The method as claimed in claim 7, wherein a single side band mixer is used to mix the first output frequency and the intervallic output frequency.

19. The method as claimed in claim 7, wherein a single side band mixer is used to mix the second output frequency and the first intervallic frequency.

20. A frequency synthesizer for generating a plurality frequencies in a multi-band orthogonal frequency division multiplexing (MB-OFDM) ultra wideband (UWB) system, the frequencies comprising first to fourteenth frequencies from low to high, any two neighboring thereof separating by a basic intervallic frequency, the frequency synthesizer comprising:
a first phase locked loop and a first mixer to generate a first frequency group comprising the first to third frequencies;
a second mixer to perform a frequency mixing procedure on the first frequency group to generate second, third and fifth frequency groups, the second, third and fifth frequency groups comprising the fourth to sixth frequencies, the seventh to ninth frequencies, and the thirteenth to fourteenth frequencies, respectively; and
a third mixer to perform a frequency mixing procedure on the fifth frequency group to generate a fourth frequency group comprising the tenth to twelfth frequencies.

21. The frequency synthesizer as claimed in claim 20, further comprising an intervallic frequency generator to generate a fourth intervallic frequency equal to the basic intervallic frequency; and wherein the first phase locked loop generates the second frequency, and the first mixer mixes the second frequency and the fourth intervallic frequency to generate the first frequency group.

22. The frequency synthesizer as claimed in claim 20, further comprising an intervallic frequency generator to generate first to third intervallic frequencies all integers times the basic intervallic frequency; and wherein the second mixer mixes the first frequency group and the first to third intervallic frequencies to generate the second, third and fifth frequency groups, respectively.

23. The frequency synthesizer as claimed in claim 20, further comprising an intervallic frequency generator to generate a first intervallic frequency an integer times the basic intervallic frequency; and wherein the third mixer mixes the fifth frequency group and the first intervallic frequency to generate the fourth frequency group.

24. The frequency synthesizer as claimed in claim 21, wherein the intervallic frequency generator further generates first to third intervallic frequencies all integers times the basic intervallic frequency; wherein the second mixer mixes the first frequency group and the first to third intervallic frequencies to generate the second, third and fifth frequency groups, respectively; and wherein the third mixer mixes the fifth frequency group and the first intervallic frequency to generate the fourth frequency group.

25. A frequency synthesizer for generating a plurality frequencies in a multi-band orthogonal frequency division multiplexing (MB-OFDM) ultra wideband (UWB) system, the frequencies comprising first to fifteenth frequencies from low to high, any two neighboring thereof separating by a basic intervallic frequency, the frequency synthesizer comprising:
a first phase locked loop generating an initial signal having a frequency equal to the second frequency;
an intervallic frequency generator generating first to third interval signals having frequencies with magnitudes in ascending order and all integers times the basic intervallic frequency, selecting one thereof as an intervallic output signal, and generating a fourth interval signal having a frequency equal to the basic intervallic frequency;
a first mixer performing a frequency mixing procedure on the initial signal and the fourth interval signal to generate a first output signal having a frequency equal to one of the first to third frequencies;
a second mixer performing a frequency mixing procedure on the first output signal and the intervallic output signal to generate a second output signal having a frequency equal to one of the fourth to ninth frequencies, thirteenth to fourteenth frequencies, and fifteenth frequency; and
a third mixer performing a frequency mixing procedure on the second output signal and the first intervallic signal to generate a third output signal having a frequency equal to one of the tenth to twelfth frequencies.

26. The frequency synthesizer as claimed in claim 25, further comprising a multiplexer receiving the first to third output signals and selecting one thereof as a final output signal.

27. The frequency synthesizer as claimed in claim 25, wherein the frequencies of the first to third intervallic are 3, 6 and 12 times the basic intervallic frequency, respectively.

28. The frequency synthesizer as claimed in claim 25, wherein the intervallic frequency generator comprises:
- a second phase locked loop comprising:
  - a phase frequency detector receiving a reference signal and a feedback signal;
  - a voltage controlled oscillator generating the second and third interval signals;
  - a first divider dividing the frequency of the second interval signal by a first integer to generate the first interval signal;
  - a second divider dividing the frequency of the first interval signal by a second integer to generate the fourth interval signal; and
  - a third divider dividing the frequency of the fourth interval signal by a third integer to generate the feedback signal; and
- a multiplexer module receiving the first to third interval signal and selecting one thereof as the intervallic output signal.

29. The frequency synthesizer as claimed in claim 28, wherein the voltage controlled oscillator comprises:
- first to fourth differential delay cells connected in series, each having a positive-phase input, a negative-phase input, a positive-phase output, a negative-phase output and a common-mode node, the inputs of one of the differential delay cells receiving a signal having a frequency equal to that of the second interval signal, outputs of each of the differential delay cells generating two of eight phases of the second interval signal, and the common-mode terminal node of each of the differential delay cells generating one of four phases of the third interval signal.

30. The frequency synthesizer as claimed in claim 25, wherein the first phase locked loop comprises a voltage controlled oscillator comprising:
- first to fourth differential delay cells connected in series, each having a positive-phase input, a negative-phase input, a positive-phase output, a negative-phase output and a common-mode node, the inputs of one of the differential delay cells receiving an input signal having a frequency equal to half the second frequency, outputs of each of the differential delay cells generating two of eight phases of the input signal, and the common-mode terminal node of each of the each of the differential delay cells generating one of four phases of the initial signal.

31. The frequency synthesizer as claimed in claim 28, wherein the first, second and third integers are 2, 3 and 8, respectively.

32. The frequency synthesizer as claimed in claim 31, wherein the second divider comprises:
- a first oscillator comprising first to third D flip-flops, each clocked by an in phase of the first interval signal, the second D flip-flop generates an in-phase of the fourth interval signal;
- a second oscillator comprising fourth to sixth D flip-flops, each clocked by a quadrature phase of the first interval signal, the sixth D flip-flop generates a quadrature phase of the fourth interval signal; and
- a phase alignment module coupled between the first and second oscillator and comprising first to six buffers to align phase orders of the in phase and quadrature phase of the fourth interval signal.

33. The frequency synthesizer as claimed in claim 25, wherein the first, second and third mixers comprise single side band mixers, respectively.

34. The frequency synthesizer as claimed in claim 25, wherein the second mixer comprises:
- a single side band mixer circuit mixing the first output signal and the intervallic output signal to generate an mixing output signal; and
- an output circuit comprising:
- an inductance-capacitance tank comprising two inductors, two capacitors, and capacitor switches each connected to one of the capacitors; and
- two transistors having gates each receiving one phase of the mixing output signal and first source/drains both connecting to the inductance-capacitance tank and each outputting one phase of the second output signal.

* * * * *